United States Patent [19]

Ueda et al.

[11] Patent Number: 6,037,847
[45] Date of Patent: *Mar. 14, 2000

[54] SURFACE ACOUSTIC WAVE DEVICE USING A LEAKY SURFACE ACOUSTIC WAVE WITH AN OPTIMIZED CUT ANGLE OF A PIEZOELECTRIC SUBSTRATE

[75] Inventors: Masanori Ueda; Osamu Kawachi; Gou Endoh; Osamu Ikata, all of Kawasaki; Ken-ya Hashimoto, Funabashi; Masatsune Yamaguchi, Sakura, all of Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/729,746

[22] Filed: Oct. 7, 1996

[30] Foreign Application Priority Data

| Oct. 13, 1995 | [JP] | Japan | 7-265466 |
| Jul. 9, 1996 | [JP] | Japan | 8-179551 |

[51] Int. Cl.[7] .............. H03H 9/25; H03H 9/64; H03H 9/145
[52] U.S. Cl. .............. 333/193; 310/313 A; 310/313 B; 310/360; 333/194
[58] Field of Search .................. 333/193–196; 310/313 R, 313 B, 313 C, 313 D, 313 A, 360, 363

[56] References Cited

U.S. PATENT DOCUMENTS

| Re. 35,204 | 4/1996 | Lewis | 310/313 A |
| 4,159,435 | 6/1979 | Lewis | 310/313 A |
| 5,485,051 | 1/1996 | Tera et al. | 333/193 X |
| 5,506,552 | 4/1996 | Seki et al. | 333/195 |
| 5,559,481 | 9/1996 | Satoh et al. | 333/193 |
| 5,592,135 | 1/1997 | Taguchi et al. | 333/193 |
| 5,654,680 | 8/1997 | Kwan et al. | 333/195 |
| 5,729,186 | 3/1998 | Seki et al. | 333/194 |
| 5,874,869 | 2/1999 | Ueda et al. | 333/195 X |

FOREIGN PATENT DOCUMENTS

| 51-47354 | 4/1976 | Japan . |
| 53-118338 | 10/1978 | Japan . |
| 58-33310 | 2/1983 | Japan . |
| 59-143411 | 8/1984 | Japan . |
| 7-212183 | 8/1995 | Japan . |
| 61-43007 | 3/1986 | Japan . |
| 61-41446 | 9/1986 | Japan . |
| 5-28004 | 4/1993 | Japan . |
| 5-121996 | 5/1993 | Japan | 333/193 |
| 5-183380 | 7/1993 | Japan . |

(List continued on next page.)

OTHER PUBLICATIONS

"Propagation and Amplification of Rayleigh Waves and Piezoelectric Leaky Surface Waves in LiNbO$_3$", Yamanouchi et al, *J. Appl. Phys.*, vol. 43, No. 3, Mar. 1972, pp. 856–862.

"Development of Low–Loss Band–Pass Filters Using Saw Resonators for Portable Telephones", Ikata et al, *1992 Ultrasonics Symposium*, pp. 111–115.

(List continued on next page.)

*Primary Examiner*—Benny Lee
*Assistant Examiner*—Barbara Summons
*Attorney, Agent, or Firm*—Nikaido, Marmelstein, Murray & Oram LLP

[57] ABSTRACT

A surface acoustic wave device includes a piezoelectric substrate of a single crystal LiTaO$_3$ and an electrode pattern provided on the piezoelectric substrate. The electrode pattern contains Al as a primary component and has a thickness in a range of 0.03–0.15 times a wavelength of a surface acoustic wave excited on the piezoelectric substrate. The piezoelectric substrate has an orientation rotated about an X-axis thereof from a Y-axis thereof toward a Z-axis thereof, with a rotational angle of 39–46°.

24 Claims, 17 Drawing Sheets

FOREIGN PATENT DOCUMENTS

| | | |
|---|---|---|
| 6-85597 | 3/1994 | Japan . |
| 6-164306 | 6/1994 | Japan . |
| 6-188673 | 7/1994 | Japan ..................................... 333/193 |

OTHER PUBLICATIONS

"SH–Type and Rayleigh–type Surface Waves in Rotated Y–Cut $LiTaO_3$", Nakamura et al, US77–42, 1997, pp. 31–36.

"Low Loss Ladder Type SAW Filter in the Range of 300 to 400 MHz", Ueda et al, *1994 IEEE International Ultrasonics Symposium*, Nov. 1–4, 1994.

"Improved Material Constants for $LiNbO_3$ and $LiTaO_3$", Kovacs et al, *1990 Ultrasonics Symposium*, pp. 435–438.

"Characteristics of Leaky SAWs on 36–$LiTaO_3$ in Periodic Structures of Heavy Electrodes", Plessky et al, *1993 Ultrasonics Symposium*, pp. 1239–1242.

"Radiation Conductance and Grating Reflectivity Weighting Parameters for Dual Mode Leaky–SAW Resonators Filter Design", Edmondson et al, *Proceedings of 1994 IEEE Ultrasonics Symposium*, Nov. 1–4, 1994.

SURFACE ACOUSTIC WAVE DEVICE USING A LEAKY SURFACE ACOUSTIC WAVE WITH AN OPTIMIZED CUT ANGLE OF A PIEZOELECTRIC SUBSTRATE

BACKGROUND OF THE INVENTION

The present invention generally relates to surface acoustic wave (SAW) devices and more particularly to a SAW device having an improved pass-band characteristic particularly in a super high frequency band including GHz band.

Surface acoustic wave (SAW) devices are used extensively in high frequency circuits of compact radio telecommunication apparatuses including those for portable use, to form filters and resonators. Such SAW devices are generally formed on a single crystal or polycrystalline piezoelectric substrate. Among others, a single crystal substrate of $LiNbO_3$ designated as 64° Y-X cut $LiNbO_3$ (K. Yamanouchi and K. Shibayama, J. Appl. Phys. vol.43, no.3, March 1972, pp.856) and a single crystal substrate of $LiTaO_3$ designated as 36° Y-X cut $LiTaO_3$ are used extensively. A 64° Y-X cut $LiNbO_3$ substrate is a 64° rotated Y-cut plate of a single crystal $LiNbO_3$ in which the direction of propagation of the surface acoustic wave is set in the X-direction. On the other hand, a 36° Y-X cut $LiTaO_3$ substrate is a 36° rotated Y-cut plate of a single crystal $LiTaO_3$ in which the direction of propagation of the surface acoustic wave is set in the X-direction.

However, these optimized cut angles, used conventionally in the piezoelectric substrates of $LiNbO_3$ or $LiTaO_3$, provide an optimum result only when the effect of additional mass, caused by the electrodes on the substrate, is ignored. Thus, while the substrates formed with the foregoing, conventional cut angles may provide an optimized result in the SAW devices for use in a low frequency band lower than several hundred MHz where the wavelength of the excited surface acoustic wave is sufficiently long as compared with the thickness of the electrodes, the substrate may be inappropriate for GHz applications as is required in recent portable telephone systems, due to the thickness of the electrodes which can no longer be ignored in view of the reduced wavelength of the surface acoustic waves excited therein. In such a high frequency band, the effect of the mass of the electrode is conspicuous.

It is possible, in a SAW device for use in such a super high frequency band, to expand the passband of a SAW filter or to decrease a capacitance ratio r of a SAW resonator, when the thickness of the electrode on the piezoelectric substrate is increased. By doing so, the apparent electromechanical coupling coefficients are increased. However, the SAW device of such a construction raises a problem of increased bulk wave emission from the electrodes, resulting in an increased propagation loss of the surface acoustic wave. The bulk waves emitted from the electrode as such are called SSBW (surface skimming bulk wave) and the surface acoustic wave that accompanies a SSBW is called LSAW (leaky surface acoustic wave). As to the propagation loss of the LSAW in a SAW filter that uses a thick electrode film provided on a 36° Y-X cut $LiTaO_3$ substrate or on a 64° Y-X cut $LiNbO_3$ substrate, reference should be made to Plessky et al. (V. S. Plessky and C. S. Hartmann, Proc. 1993 IEEE Ultrasonics Symp., pp.1239–1242) and Edmonson et al. (P. J. Edmonson and C. K. Campbell, Proc. 1994 IEEE Ultrasonics Symp., pp.75–79).

In the conventional SAW filters designed for using a LSAW and constructed on a 36° Y-X cut $LiTaO_3$ substrate or on a 64° Y-X cut $LiNbO_3$ substrate, it is further noted that the sound velocity of the surface acoustic wave is close to the sound velocity of the bulk wave when the thickness of the electrode is small. In such a case, there appears a spurious peak in the vicinity of the passband of the SAW filter due to the bulk wave emission from the electrode. See Ueda et al. (M. Ueda et al., Proc. 1994 IEEE Ultrasonics Symp. pp.143–146).

FIG. 1 shows the spurious peaks A and B reported by Ueda et al.(op. cit), wherein the spurious peaks A and B are formed in the vicinity of the passband of the SAW filter as a result of the bulk wave emission as noted above. The result of FIG. 1 is obtained for a SAW filter that is formed on a 36° Y-X cut $LiTaO_3$ substrate and carries thereon an interdigital electrode of an Al—Cu alloy with a thickness of 0.49 $\mu$m. It should be noted that the thickness of the electrode corresponds to 3% of the wavelength of the surface acoustic wave excited in the SAW device.

Referring to FIG. 1, it will be noted that the spurious peak B is located outside the passband formed in the vicinity of 330 MHz, while the spurious peak A is formed within the passband and forms an undesirable ripple therein.

As the sound velocity of a SSBW does not change with the thickness of the electrode contrary to the sound velocity of a LSAW that changes sound velocity depending upon additional mass and hence the thickness of the electrode provided on the substrate of a SAW device, the sound velocity of the LSAW decreases relatively to the sound velocity of the SSBW when the SAW device is operated in a high frequency band such as a GHz band, resulting in a shift of the passband of the SAW filter relative to the spurious peak B. Thereby, a desirable flat passband characteristic would be obtained for the SAW filter.

However, such an increase of the electrode thickness with respect to the wavelength of the surface acoustic wave leads to the problem of increased loss of the LSAW due to the emission of the SSBW as already explained. Further, such an increase of the electrode thickness results in a deterioration of the shape factor of the SAW filter. As will be explained later, the shape factor of a SAW filter represents the steepness as well as the width of the passband characteristics of the filter. More specifically, the filter characteristic becomes broad and undefined when the shape factor of the SAW filter is poor.

Further, in a SAW filter for use in a super high frequency band including GHZ band, it is necessary to secure a certain thickness for the electrode so as to reduce the resistance of the interdigital electrodes. Such a requirement of increased thickness of the electrode is contradictory with the requirement of reduced loss and improved shape factor of the SAW device.

SUMMARY OF THE INVENTION

Accordingly, it is a general object of the present invention to provide a novel and useful SAW device wherein the foregoing problems are eliminated.

Another and more specific object of the present invention is to provide a SAW device constructed on a piezoelectric substrate that is cut with an angle optimized with respect to a thickness of an electrode provided thereon.

Another object of the present invention is to provide a SAW device having a pass-band that avoids a spurious peak caused by a bulk wave emission.

Another object of the present invention is to provide a surface acoustic wave device, comprising:

a piezoelectric substrate of a single crystal $LiTaO_3$; and an electrode pattern provided on a surface of said piezoelectric substrate and containing Al as a primary component;

said electrode pattern forming a resonator having a thickness in a range of about 0.03–0.15 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle in a range larger than 39° but smaller than about 46°.

Another object of the present invention is to provide a surface acoustic wave filter, comprising:

a piezoelectric substrate of a single crystal LiTaO$_3$; and an electrode pattern provided on a surface of said piezoelectric substrate and containing Al as a primary component, said electrode pattern including an interdigital electrode;

said electrode pattern forming a resonator having a thickness in a range of about 0.03–0.15 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle in a range larger than 39° but smaller than about 46°.

Another object of the present invention is to provide a surface acoustic wave device, comprising:

a piezoelectric substrate of a single crystal LiTaO$_3$; and an electrode pattern provided on a surface of said piezoelectric substrate and containing Au as a primary component;

said electrode pattern forming a resonator having a thickness in a range of 0.004–0.021 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle larger than 39° but smaller than about 46°.

Another object of the present invention is to provide a surface acoustic wave device, comprising:

a piezoelectric substrate of a single crystal LiTaO$_3$; and an electrode pattern provided on a surface of said piezoelectric substrate and containing Cu as a primary component;

said electrode pattern forming a resonator having a thickness in a range of 0.009–0.045 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle larger than 39° but smaller than about 46°.

According to the present invention, the angle of cut of the LiTaO$_3$ substrate is optimized with respect to the mass of the electrode provided on the surface of the substrate for minimizing the loss. Thereby, one obtains various SAW devices having a broad pass-band and improved shape factor, including a SAW filter, a SAW resonator and a SAW delay line.

Another object of the present invention is to provide a surface acoustic wave device, comprising:

a piezoelectric substrate of a single crystal LiNbO$_3$; and an electrode pattern provided on a surface of said piezoelectric substrate and containing Al as a primary component;

said electrode pattern having a thickness in a range of about 0.04–0.12 times a wavelength of a surface acoustic wave excited on said substrate, said piezoelectric substrate having an orientation rotated about an X-axis thereof, from a Y-axis thereof, toward a Z-axis thereof, with a rotational angle in a range larger than 66° but smaller than about 74°.

Another object of the present invention is to provide a surface acoustic wave device, comprising:

a piezoelectric substrate of a single crystal LiNbO$_3$; and an electrode pattern provided on a surface of said piezoelectric substrate and containing Au as a primary component;

said electrode pattern having a thickness in a range of 0.005–0.017 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle larger than 66° but smaller than about 74°.

Another object of the present invention is to provide a surface acoustic wave device, comprising:

a piezoelectric substrate of a single crystal LiNbO$_3$; and an electrode pattern provided on a surface of said piezoelectric substrate and containing Cu as a primary component;

said electrode pattern having a thickness in a range of 0.012–0.036 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle larger than 66 but smaller than about 74°.

According to the present invention, the angle of cut of the LiNbO$_3$ substrate is optimized with respect to the mass of the electrode provided on the surface of the substrate for minimizing the loss. Thereby, one obtains various SAW devices having a broad pass-band and improved shape factor, including a SAW filter, a SAW resonator and a SAW delay line.

Other objects and further features of the present invention will become apparent from the following detailed description when read in conjunction with the attached drawings.

DETAILED DESCRIPTION OF THE PREFERRED EMBODIMENTS

Figure 2:
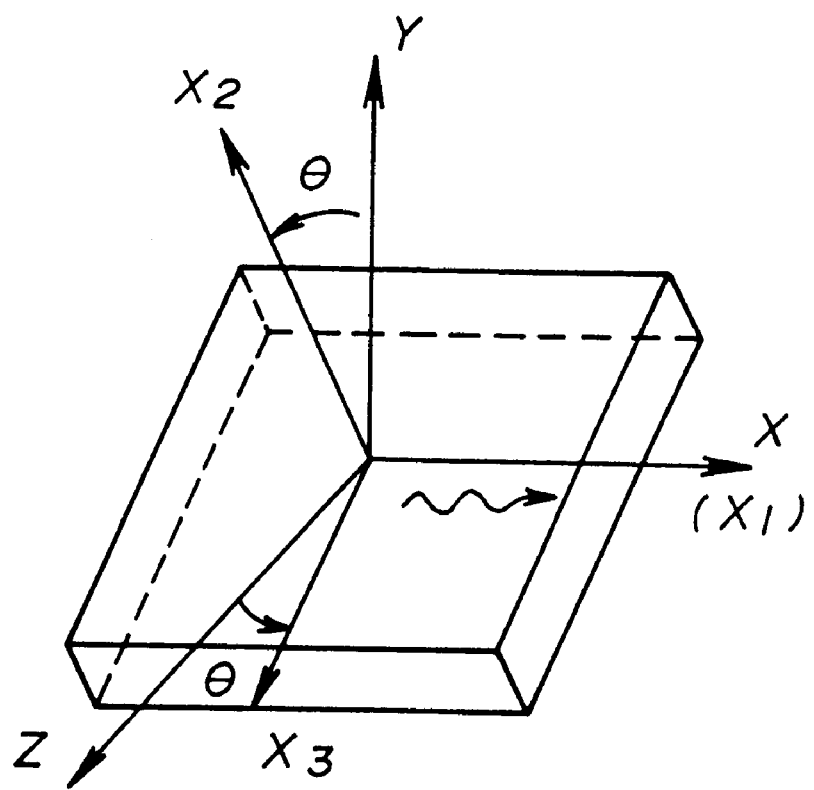
FIG. 2 is a diagram explaining the angle of cut of a piezoelectric crystal.

First, the principle of the present invention will be described with reference to FIGS. 2 and 3, wherein FIG. 2 is a diagram that explains the cut angle of a piezoelectric substrate.

Referring to FIG. 2 showing a so-called Θ-rotated Y-X cut of a single crystal substrate of LiTaO$_3$ or LiNbO$_3$, it will be noted that the piezoelectric substrate is sliced from an ingot of the single crystal LiTaO$_3$ or LiNbO$_3$ having crystal axes X, Y and Z, in a state such that the substrate is rotated about the X-axis with a rotational angle Θ from the Y-axis toward the Z-axis. Thus, the rotational angle Θ is also called the cut angle of the substrate.

Figure 3:
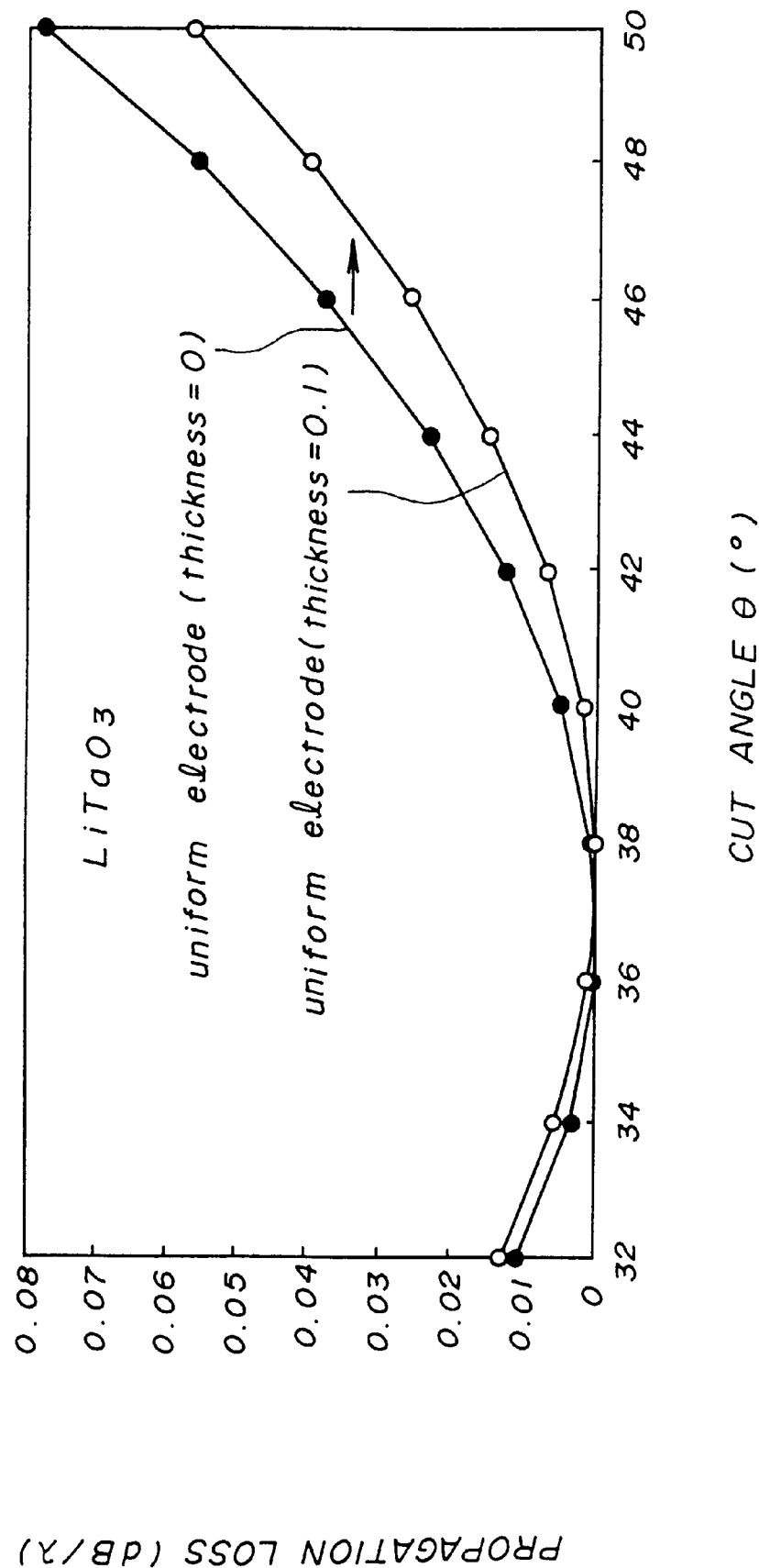
FIG. 3 is a diagram showing a propagation loss of a SAW device as a function of the cut angle of a LiTaO$_3$ substrate for a case in which a uniform electrode is provided on the substrate with various thicknesses.

FIG. 3 shows the insertion loss of a SAW resonator formed on a Θ-rotated Y-X cut LiTaO$_3$ substrate, for various cut angles Θ of the substrate.

As explained previously, a 36° Y-X cut substrate is commonly used when LiTaO$_3$ is used for the piezoelectric substrate, wherein the particular cut angle of 36° has been used in view of minimization of propagation loss for the surface acoustic wave of relatively long wavelength. See Nakamura K., et al, Shingaku Gihou US77-42, 1977, pp.31–36 (in Japanese). In the case of a SAW device constructed on a LiNbO$_3$ substrate, a cut angle of 64° has been used commonly for the substrate.

Referring to FIG. 3, the solid circles represent the result of calculation of the propagation loss of a LSAW for a SAW device in which a hypothetical electrode of zero thickness is formed uniformly over the surface of a 36° Y-X cut substrate of LiTaO$_3$. The curve represented by the solid circles clearly indicates the minimum propagation loss at the angle Θ of 36°. In the calculation of FIG. 3, crystal constants reported by Kovacs were used (Kovacs, G., et al., Proc. 1990 IEEE Ultrasonics Symp. pp.435–438).

In the operation of the SAW device in a super high frequency band such as a GHz band, however, the thickness of the electrode cannot be ignored compared with the wavelength of the surface acoustic wave that is excited in the SAW device, as already explained. Thus, in the operation of the SAW device in such a super high frequency band, the effect of the added mass of the electrode is conspicuous. The inventors of the present invention have discovered that, because of the effect of such an added mass of the electrode, the curve representing the propagation loss in FIG. 3 shifts in the direction indicated by an arrow in FIG. 3, from the curve represented by the solid circles to a curve represented by open circles. Associated with the shift of the transmission loss as such, the optimum angle Θ that provides the minimum transmission loss increases from 36° to 38° or more. In FIG. 3, the result represented by the open circles is for the case in which the electrode is provided on the piezoelectric substrate with a thickness of about 10% the wavelength of the excited surface acoustic wave.

Figure 4:
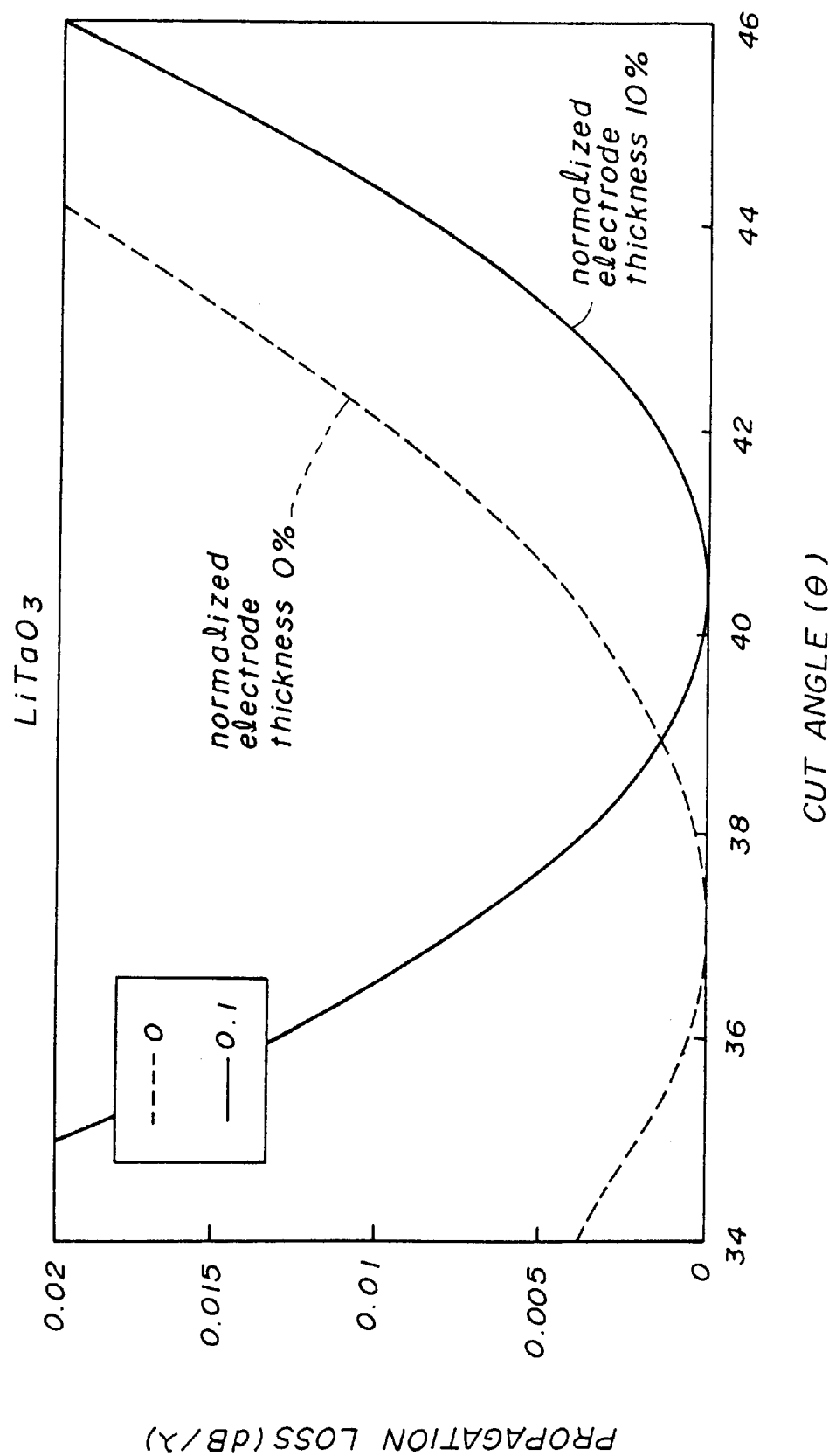
FIG. 4 is a diagram showing a propagation loss of a SAW device as a function of the cut angle of the LiTaO$_3$ substrate for a case in which a grating electrode is provided on the substrate with various thicknesses.

FIG. 4 shows the propagation loss for the case in which a grating electrode of Al is provided on a LiTaO$_3$ substrate as a function of the cut angle Θ of the substrate. In FIG. 4, the broken line represents the result in which the thickness of the Al electrode is zero, while the continuous line indicates the result in which the electrode has a normalized thickness of 10% with respect to the wavelength of the excited surface wave. Obviously, the cut angle that provides the minimum of the propagation loss is shifted to the side of higher cut angle when a grating electrode of finite thickness is provided on the substrate.

Figure 1:
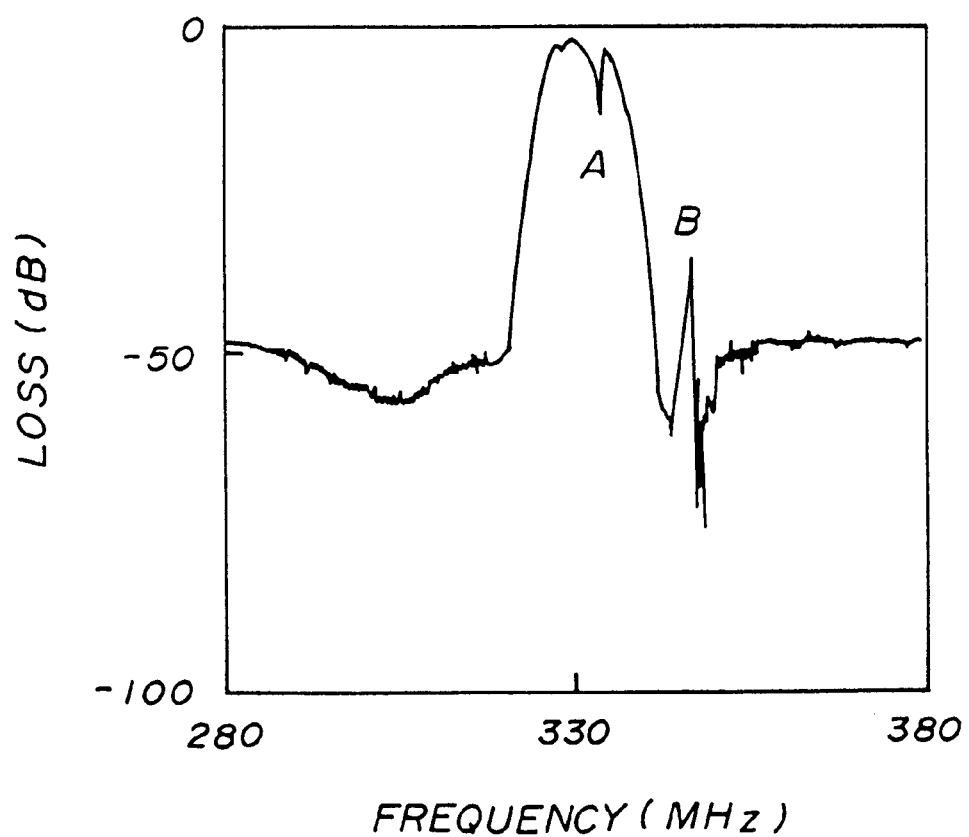
FIG. 1 is a diagram showing the passband characteristics of a typical conventional SAW filter.

Thus, the results of FIGS. 3 and 4 clearly indicate that one can realize a SAW device having a high Q-factor and hence low attenuation of surface acoustic waves in a GHz band by setting the cut angle Θ higher than the conventionally used cut angle of 36° when using a single crystal LiTaO$_3$ for the piezoelectric substrate. Further, associated with the added mass effect of the electrode in such a super-high frequency, the passband of the SAW filter shown in FIG. 1 shifts in the direction of the lower frequency side with respect to the spurious peaks A and B, resulting in a SAW device substantially free from ripples in the pass-band. As noted already, the spurious peaks A and B are caused by the bulk wave emission and are not affected by the added mass of the electrode.

Further, the inventors have discovered that the shape factor of the pass-band changes also with the cut angle Θ. More specifically, the SAW filter constructed on a LiTaO$_3$ substrate with the cut angle Θ larger than the conventionally used cut angle, provides not only an improved passband characteristic but also an improved shape factor in the operation of near GHz bands.

Figure 5:
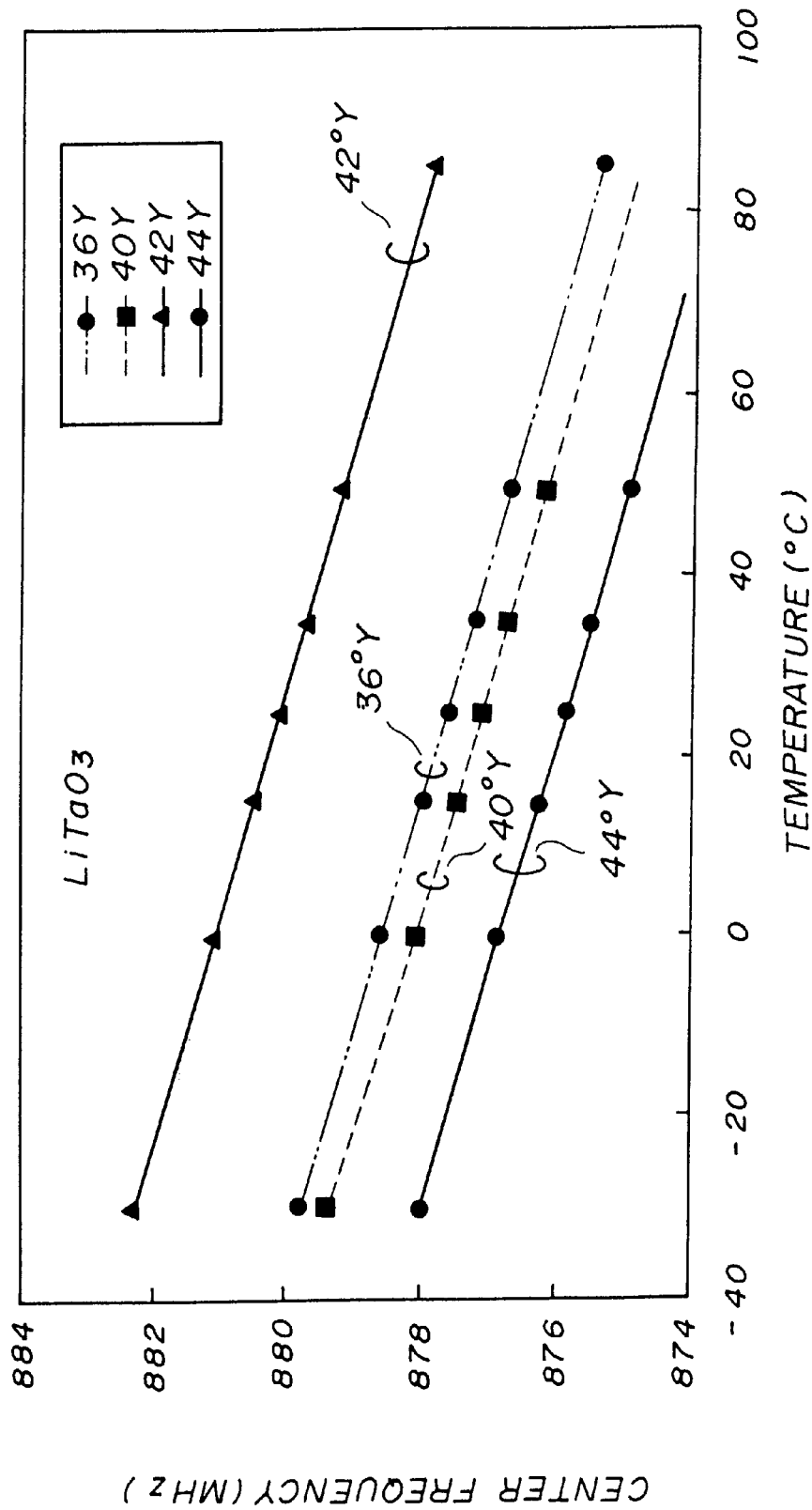
FIG. 5 is a diagram showing the relationship between a center frequency and the temperature for a SAW device constructed on a LiTaO$_3$ substrate with various cut angles.
Figure 6:
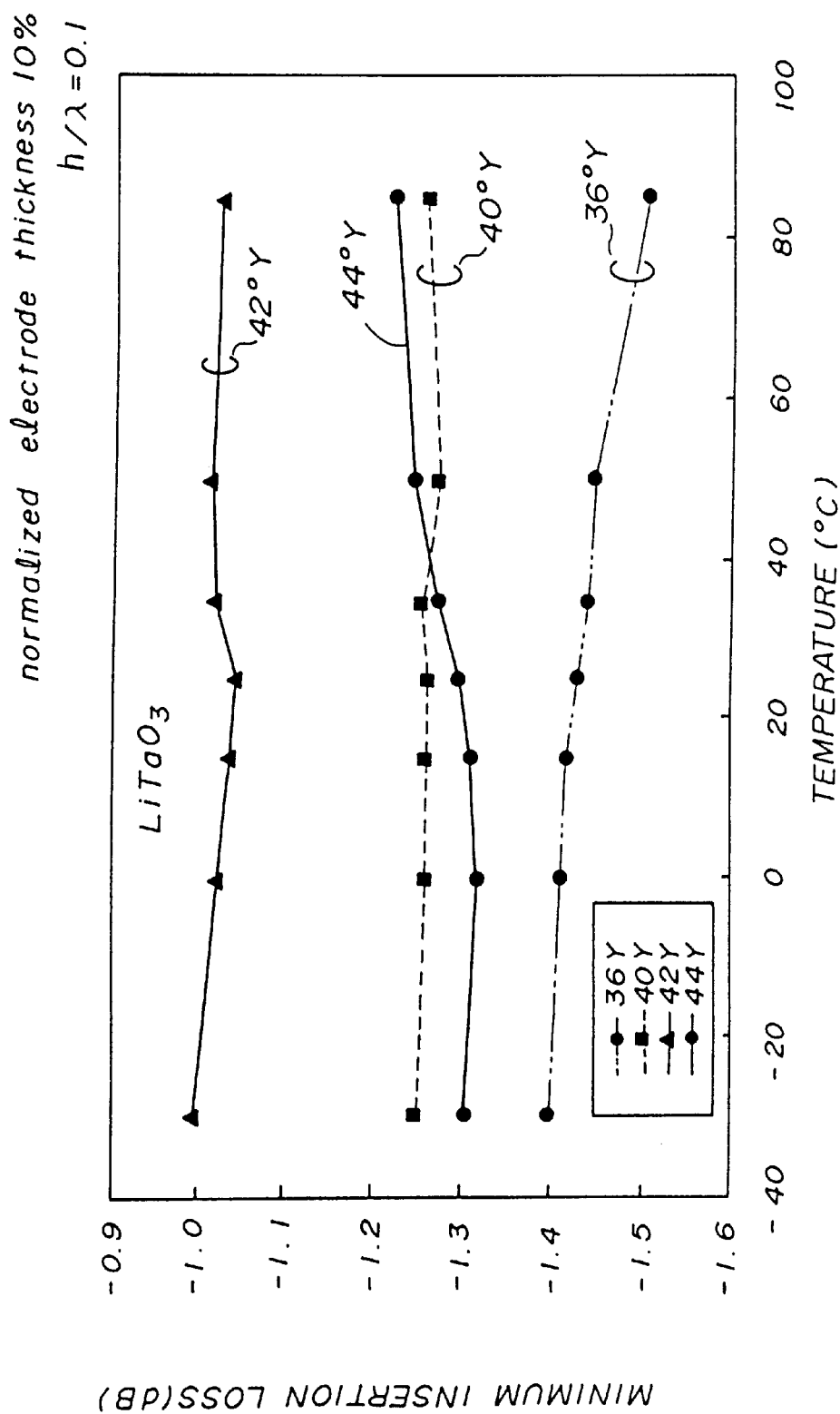
FIG. 6 is a diagram showing a temperature dependence of a minimum insertion loss of a SAW device constructed on a LiTaO$_3$ substrate having various cut angles.

FIGS. 5 and 6 show respectively the temperature dependence of the center frequency and the minimum insertion loss for a SAW filter constructed on a LiTaO$_3$ substrate. In the experiments of FIGS. 5 and 6, a SAW filter to be described later with reference to FIGS. 8A and 8B was used, in which the electrode was formed on various $LiTaO_3$ substrates having various cut angles (36° Y, 40° Y, 42° Y, 44° Y), with a normalized thickness of about 10% the wavelength of the surface acoustic wave excited on the substrate.

As will be noted clearly from FIG. 5, the SAW filter shows substantially the same temperature dependence of the center frequency, irrespective of the cut angle of the substrate. The observed scattering of the central frequency is attributed to the variation of the sound velocity in the substrate and the preparation process of the device.

Further, FIG. 6 indicates that, at least in the normal temperature range of −35° C.−85° C., one can reduce the minimum insertion loss with respect to the device constructed on a 36° Y-X $LiTaO_3$ substrate, by setting the cut angle to 40° Y–44° Y. Particularly, it can be seen that the magnitude of the variation of the minimum insertion loss is reduced also by setting the cut angle to the range between 40° Y and 42° Y.

Figure 7:
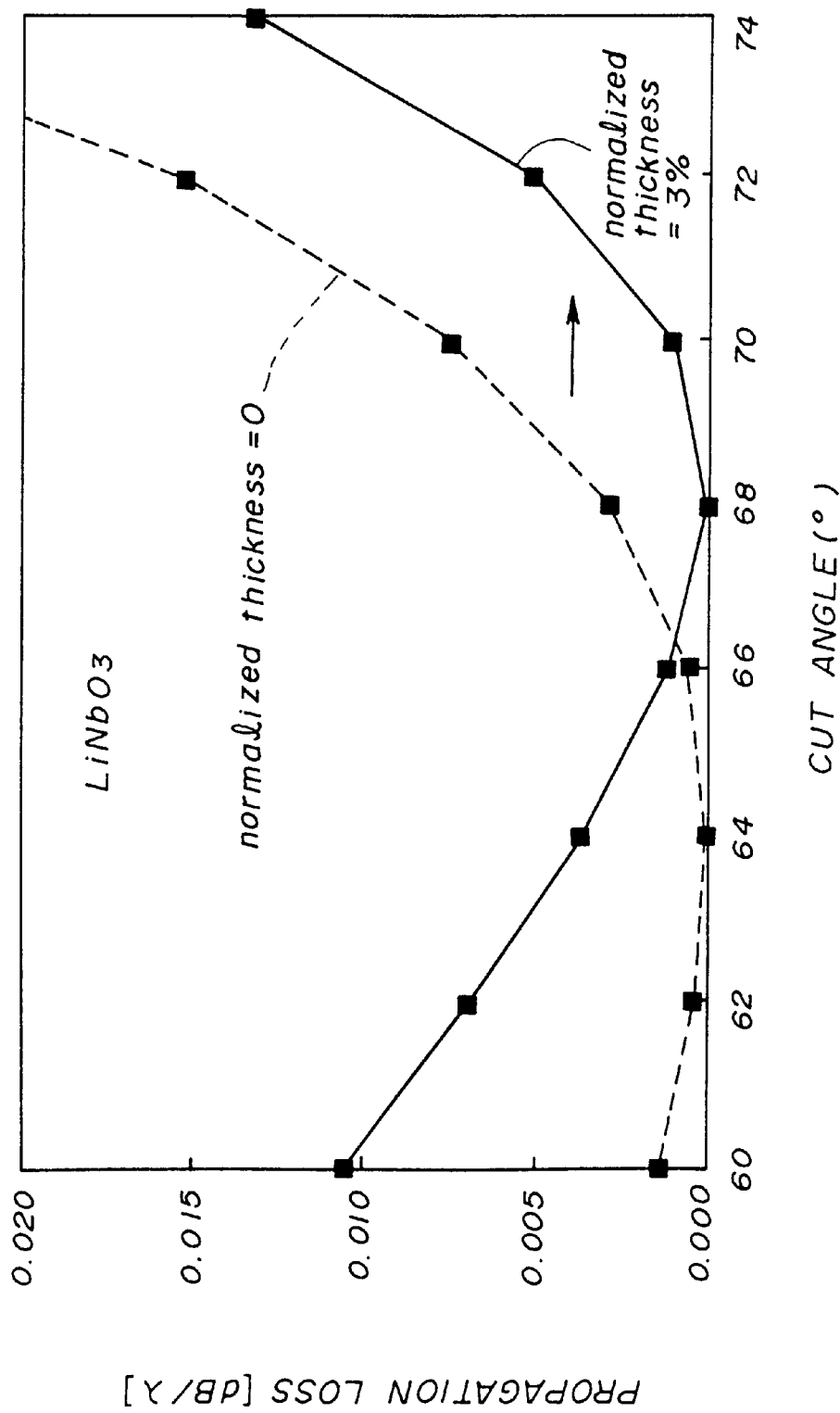
FIG. 7 is a diagram showing a propagation loss of a SAW device as a function of the cut angle of a LiNbO$_3$ substrate for a case in which a uniform electrode is provided on the substrate with various thicknesses.

FIG. 7 shows the insertion loss of a SAW resonator constructed on a Y-X substrate of $LiNbO_3$ for various rotation angles Θ.

Referring to FIG. 7, the curve represented by a broken line indicates a calculated propagation loss of a LSAW for the case in which a uniform electrode is provided on a 64° Y-X substrate of $LiNbO_3$, with a zero thickness of the electrode. The result of FIG. 7 indicates that a minimum of propagation loss is achieved by setting the cut angle Θ to 64°. It should be noted that the calculation of FIG. 7 is made by using the crystal constants reported by Warner, et al, J. Acoustic. Soc. Amer., 42, 1967, pp.1223–1231.

In the case of the operation in a shorter wavelength region such as GHz band, the effect of the thickness of the electrode is no longer negligible in view of the increased relative thickness of the electrode with respect to the wavelength of the excited surface wave. The inventor of the present invention has discovered that, because of such an added mass effect of the electrode, the characteristic curve of FIG. 7 shifts to the higher side of the cut angle Θ as indicated by an arrow in FIG. 7. Associated therewith, the cut angle Θ that provides the minimum propagation loss shifts also in the higher angle side, as indicated in FIG. 7 by a continuous line. In FIG. 7, it should be noted that the continuous line represents the case in which the electrode has a thickness of about 3% the wavelength of the surface acoustic wave excited on the substrate.

The result of FIG. 7 clearly indicates that one can obtain a high Q SAW device that shows a reduced attenuation of the surface acoustic wave in a GHz band, by setting the cut angle Θ of a single crystal $LiNbO_3$ to be higher than 64°.

Hereinafter, the present invention will be described in detail with reference to preferred embodiments.

Figure 8A:
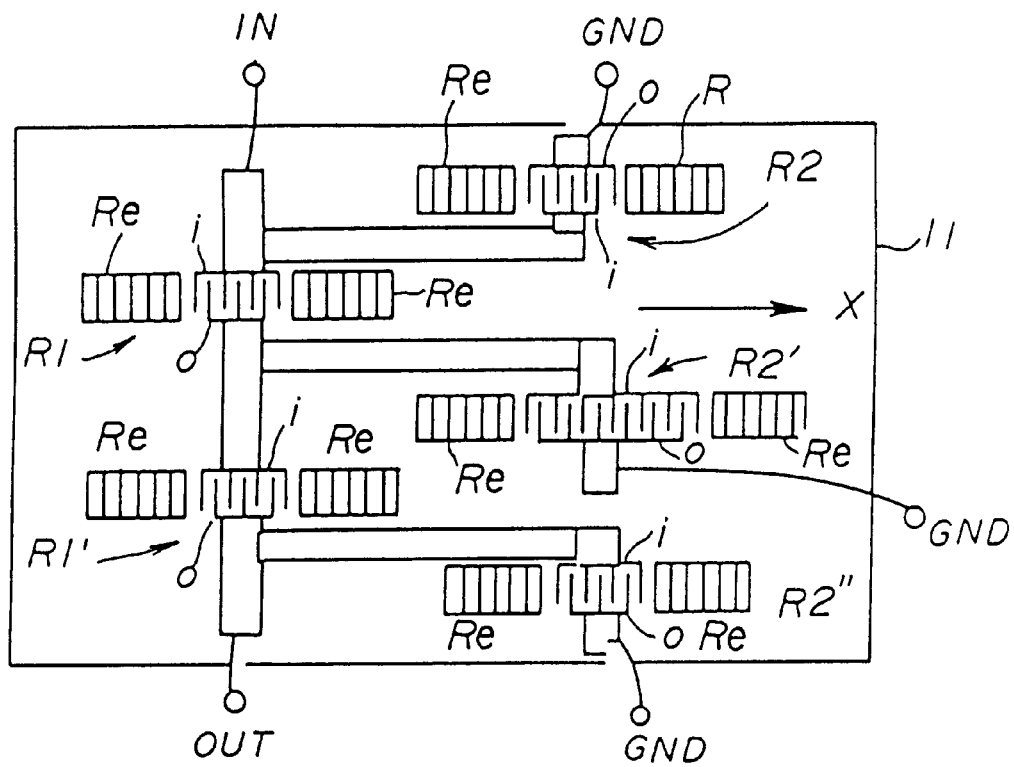
FIGS. 8A and 8B are diagrams showing the construction of a SAW filter according to a first embodiment of the present invention respectively in a plan view and in a circuit diagram.
Figure 8B:
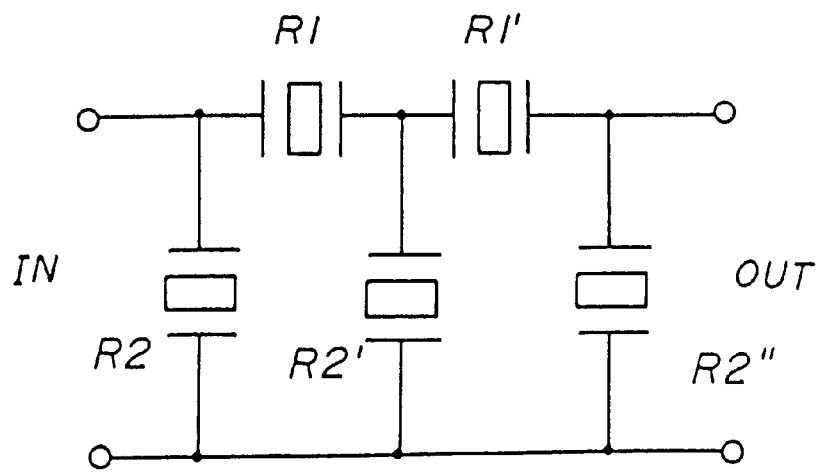

FIGS. 8A and 8B show a ladder type SAW filter according to a first embodiment of the present invention, wherein FIG. 8A shows the layout of the SAW filter in a plan view while FIG. 8B shows an equivalent circuit diagram of the device of FIG. 8A.

Referring to FIG. 8A, the SAW filter is formed on a Θ-rotated Y-X cut substrate of a $LiTaO_3$ single crystal or a $LiNbO_3$ single crystal and carries thereon a first interdigital electrode $R_1$ having an input-side electrode connected to an input terminal IN provided on the substrate, a second interdigital electrode $R_1'$ having an input-side electrode connected to an output-side electrode of the interdigital electrode $R_1$ and an output-side electrode connected to an output terminal OUT provided on the substrate, a third interdigital electrode $R_2$ having an input-side electrode connected to the foregoing input-side electrode of the interdigital electrode $R_1'$ and a grounded output-side electrode, a fourth interdigital electrode $R_2'$ having an input-side electrode connected to the foregoing output-side electrode of the interdigital electrode $R_1$ and a grounded output-side electrode, and a fifth interdigital electrode $R_2''$ having an input-side electrode connected to the output-side electrode of the interdigital electrode $R_1'$ and a grounded output-side electrode.

In each of the interdigital electrodes $R_1$, $R_1'$, $R_2$, $R_2'$, and $R_2''$, it will be noted that the interdigital electrode includes an input-side electrode i and an output-side electrode o as indicated in FIG. 8A. The input-side electrode i includes first group of electrode fingers extending parallel with each other in a first direction so as to cross the path of the surface acoustic wave propagating on the surface of the substrate in the X-axis direction. Similarly, the output-side electrode o includes second group of electrode fingers extending parallel with each other in a second, opposite direction, wherein the first group of electrode fingers and the second group of electrode fingers are disposed alternately on the substrate surface in the propagating direction of the surface acoustic wave. Further, each of the interdigital electrodes $R_1$, $R_1'$, $R_2$ and $R_2'$ is accompanied by a pair of reflectors $R_e$ disposed at both sides thereof in the X-axis direction. Each of the reflectors $R_e$ has a construction in which a plurality of mutually parallel electrode fingers are connected with each other at both ends of the electrode fingers. In the present embodiment, it should be noted that the interdigital electrodes $R_1$, $R_1'$, $R_2$ and $R_2'$ are formed of an aluminum alloy containing Al and 1 wt % of Cu, and has a thickness of about 0.4 μm corresponding to about 10% of the passband wavelength of the SAW filter.

FIG. 8B shows the equivalent circuit diagram of the filter of FIG. 8A.

Referring to FIG. 8B, the interdigital electrodes $R_1$ and $R_1'$ are connected in series, while the interdigital electrodes $R_2$, $R_2'$ and $R_2''$ are connected parallel with each other at both sides of the interdigital electrode $R_1'$ or $R_1$.

Figure 9:
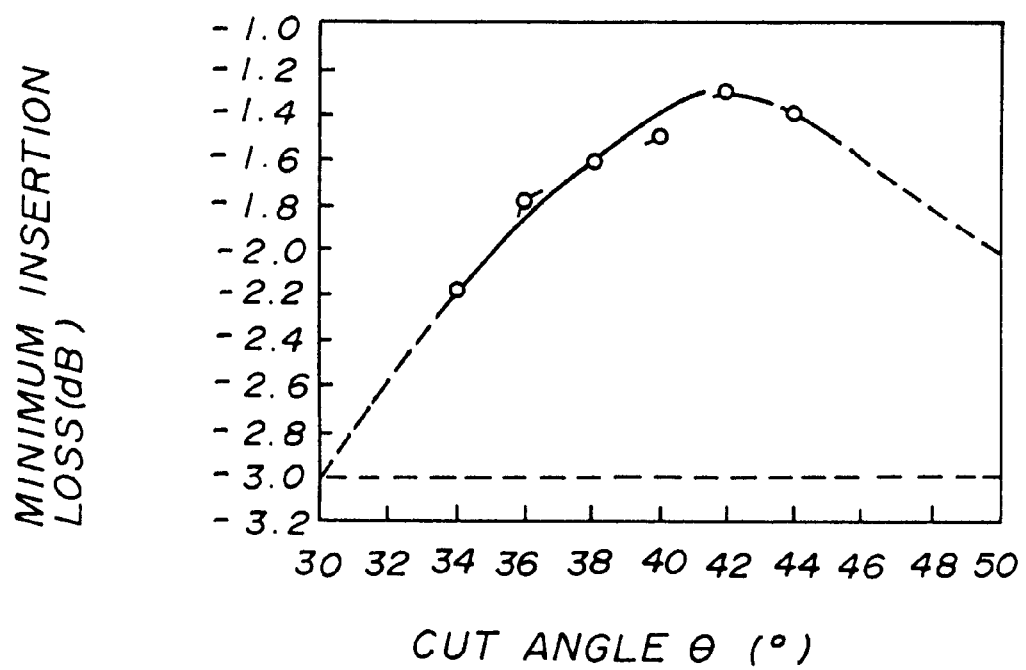
FIG. 9 is a diagram showing the relationship between a minimum insertion loss of a SAW filter and the cut angle of a LiTaO$_3$ substrate used for the SAW filter.

FIG. 9 shows the minimum insertion loss obtained experimentally for the SAW filter of FIGS. 8A and 8B for various cut angles Θ of the $LiTaO_3$ substrate 11. The minimum insertion loss includes contributions of both the propagation loss of the surface acoustic wave and the filter matching loss, while the filter matching loss is not affected by the cut angle Θ.

Referring to FIG. 9, the minimum insertion loss decreases with increasing cut angle of the substrate and reaches a minimum in the vicinity of 42°. When the cut angle Θ exceeds 42°, the minimum insertion loss starts to increase again. Thus, it will be noted that one can suppress the minimum insertion loss of the SAW filter within 1.6 dB by setting the cut angle of the $LiTaO_3$ in the range between 38° and 46°.

The inventors of the present invention have discovered that the cut angle Θ of a $LiTaO_3$ single crystal substrate also affects the shape factor of the SAW filter.

Figure 10A:
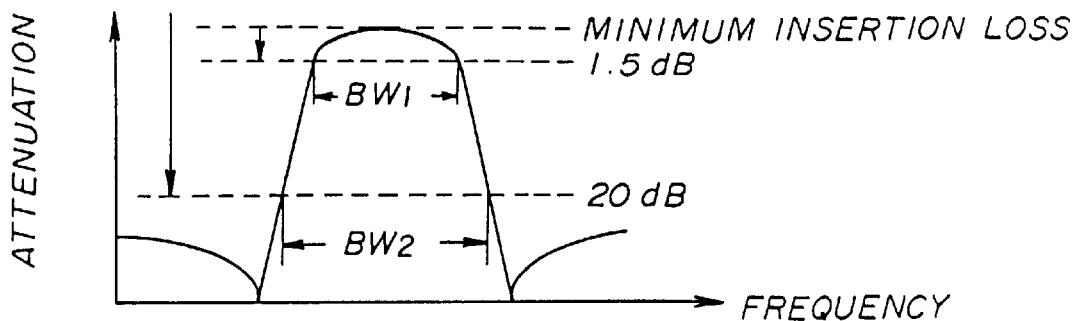
FIGS. 10A and 10B are diagrams respectively showing the definition of a shape factor and the relationship between the shape factor and the cut angle of the LiTaO$_3$ substrate.

FIG. 10A shows the definition of the shape factor.

Referring to FIG. 10A, a shape factor is defined, in terms of bandwidths $BW_1$ and $BW_2$, as $BW_1/BW_2$, in which the bandwidth $BW_1$, corresponds to a bandwidth that provides an attenuation of 1.5 dB, while the bandwidth $B_2$ corresponds to a bandwidth that provides an attenuation of 20 dB. With increasing shape factor, the filter characteristics become broad, resulting in a deterioration of the selectivity and narrowing of the passband. Thus, it is desirable for a SAW filter to have a shape factor as close to 1 as possible.

Figure 10B:
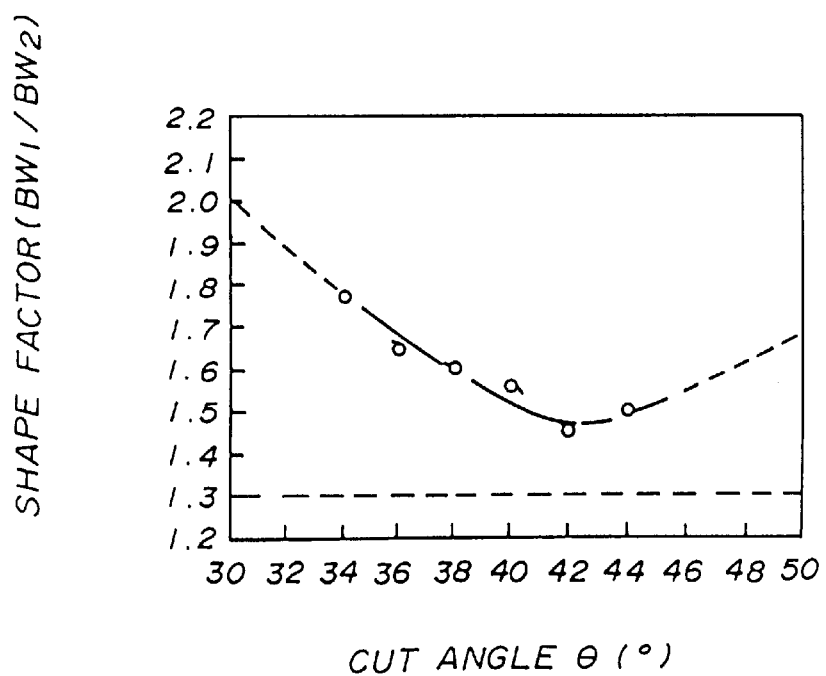

FIG. 10B shows the shape factor obtained experimentally for the SAW filter of FIGS. 8A and 8B as a function of the cut angle Θ of the piezoelectric substrate 11.

As will be noted from FIG. 10B, the shape factor approaches 1 with increasing cut angle Θ and reaches a minimum of 1.47 at the cut angle Θ of 42°. On the other hand, when the cut angle exceeds the foregoing angle of 42°, the shape factor starts to increase again, leading to a deterioration of the filter selectivity. In the SAW filter of the present invention, therefore, it is desirable to have the minimum insertion loss of 1.6 dB or less and the shape factor of 1.55 or less. In view of the relationship of FIG. 10B, therefore, one obtains an optimum cut angle Θ of 40–46°, particularly in the range of 40–44°. By setting the cut angle Θ to be 42° in particular, the minimum insertion loss is minimized and simultaneously the shape factor.

Figure 11:
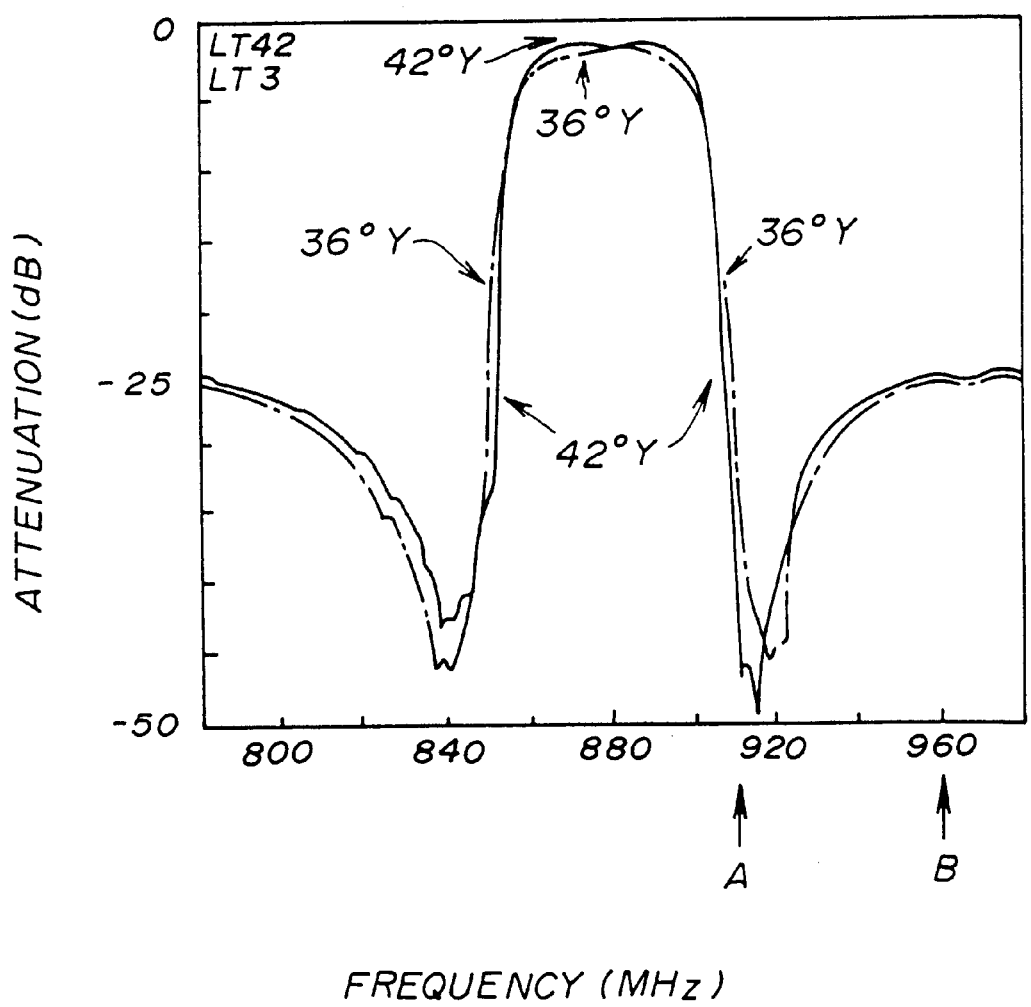
FIG. 11 is a diagram explaining the pass-band characteristics of the SAW filter shown in FIGS.8A and 8B.

FIG. 11 shows a passband characteristic obtained experimentally for the SAW filter of FIGS. 8A and 8B. Referring to FIG. 11, the continuous line represents the case in which a 42° Y-X cut LiTaO$_3$ is used for the substrate 11, while the one-dotted broken line represents the case in which a conventional 360 Y-X cut LiTaO$_3$ is used for the substrate 11.

Referring to FIG. 10, it will be noted that both SAW filters have a central frequency at 880 MHz and are characterized by a flat passband of about 40 MHz in width, defined by a sharp attenuation slope outside the pass-band, wherein the SAW filter that uses the 42° Y-X cut plate of LiTaO$_3$ for the substrate 11 provides an improved shape factor accompanied with a steeper attenuation slope outside the passband as compared with the conventional SAW filter that uses the conventional 36° Y-X cut plate of LiTaO$_3$ for the substrate 11. Further, as indicated in FIG. 11, the spurious peaks A and B caused by SSBW are now located outside the pass-band of the SAW filter formed on the 42° Y-X LiTaO$_3$ substrate.

Figure 12:
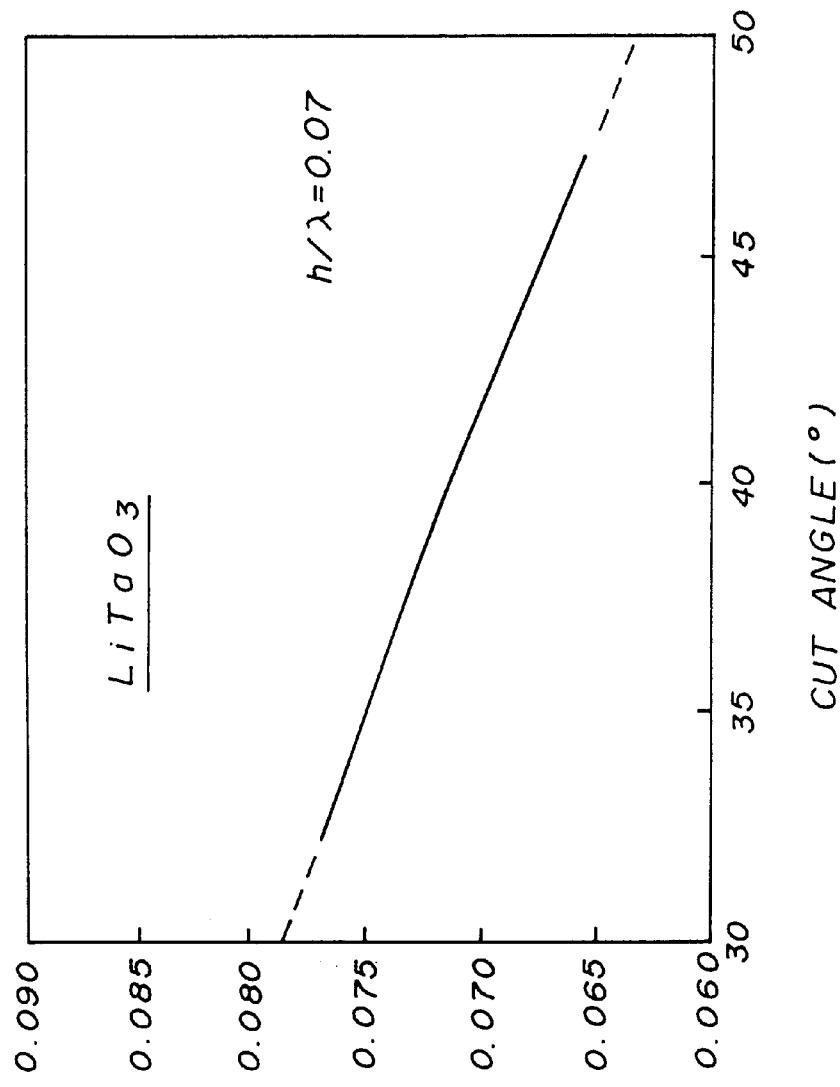
FIG. 12 is a diagram showing the relationship between the cut angle of the LiTaO$_3$ substrate and an electromechanical coupling coefficient for the SAW device shown in FIGS. 8A and 8B.

FIG. 12 shows the result of calculation of the electromechanical coupling coefficients $k^2$ of a Θ-rotated Y-X cut LiTaO$_3$ substrate carrying thereon an electrode having a thickness of about 7% of the surface acoustic wave that is excited thereon, for various cut angles Θ. The calculation was made by using the crystal constants reported by Kovacs op. cit.

Referring to FIG. 12, it will be noted that the electromechanical coupling coefficients $k^2$ show a tendency to decrease with increasing cut angle Θ. As is well known, the electromechanical coupling coefficients $k^2$ represent the ratio of the energy accumulated in a piezoelectric crystal due to the piezoelectric effect. When the value of $k^2$ is too small, various problems such as reduced pass band, appearance of ripple in the passband, and the like appear. From the relationship of FIG. 12, therefore, it is desirable to set the cut angle Θ not to exceed 46°.

Figure 13:
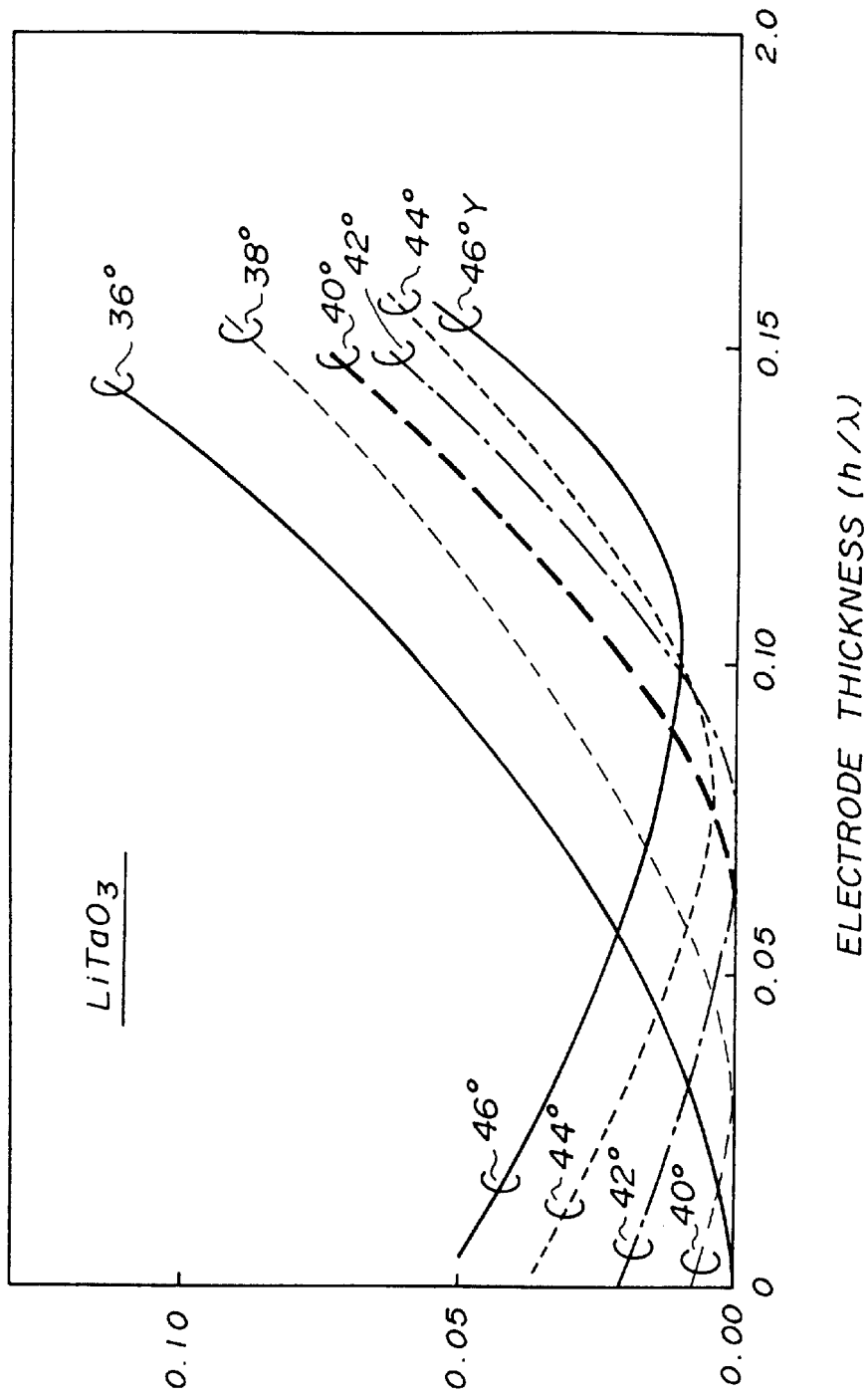
FIG. 13 is a diagram showing the relationship between the propagation loss and the electrode thickness for various cut angles of the LiTaO$_3$ substrate in the SAW device of FIGS. 8A and 8B.

FIG. 13 shows the result of calculation of the propagation loss on a SAW filter of FIGS. 8A and 8B for various cut angles Θ and for various thicknesses of the interdigital electrodes. In the calculation of FIG. 9, too, the crystal constants of Kovacs were used.

As will be noted from FIG. 13, the loss increases exponentially with the thickness of the electrode when the cut angle Θ is set below 38°. When the cut angle Θ exceeds 40°, on the other hand, the loss starts to decrease with increasing thickness of the electrode and a minimum appears in the characteristic curve. Particularly, such a minimum appears for the thickness of the electrode set larger than about 3% of the surface acoustic wavelength. In other words, FIG. 13 indicates that it is desirable to form the electrode such that the thickness, normalized by the wavelength of the surface acoustic wave, is equal to or larger than 3%. When the thickness of the electrode is excessive, problems such as difficulty in patterning the electrode or substantial change of the sound velocity with minute change of the electrode thickness appear. Thus, it is preferred to form the electrode such that the electrode thickness does not exceed 15% of the wavelength of the surface acoustic wave.

FIG. 13 also indicates that the propagation loss increases steeply at any cut angles when the thickness of the electrode of Al-alloy exceeds 15% of the wavelength of the surface acoustic wave. This indicates that emission of bulk waves becomes predominant under such conditions. Thus, in view of the foregoing, it is desirable to set the electrode thickness to fall in the range of 7–15% of the surface acoustic wavelength when the cut angle Θ is in the range between 40° and 46° and more particularly in the range of 5–10% of the surface acoustic wavelength when the cut angle Θ is in the range between 40°–44°.

Figure 14:
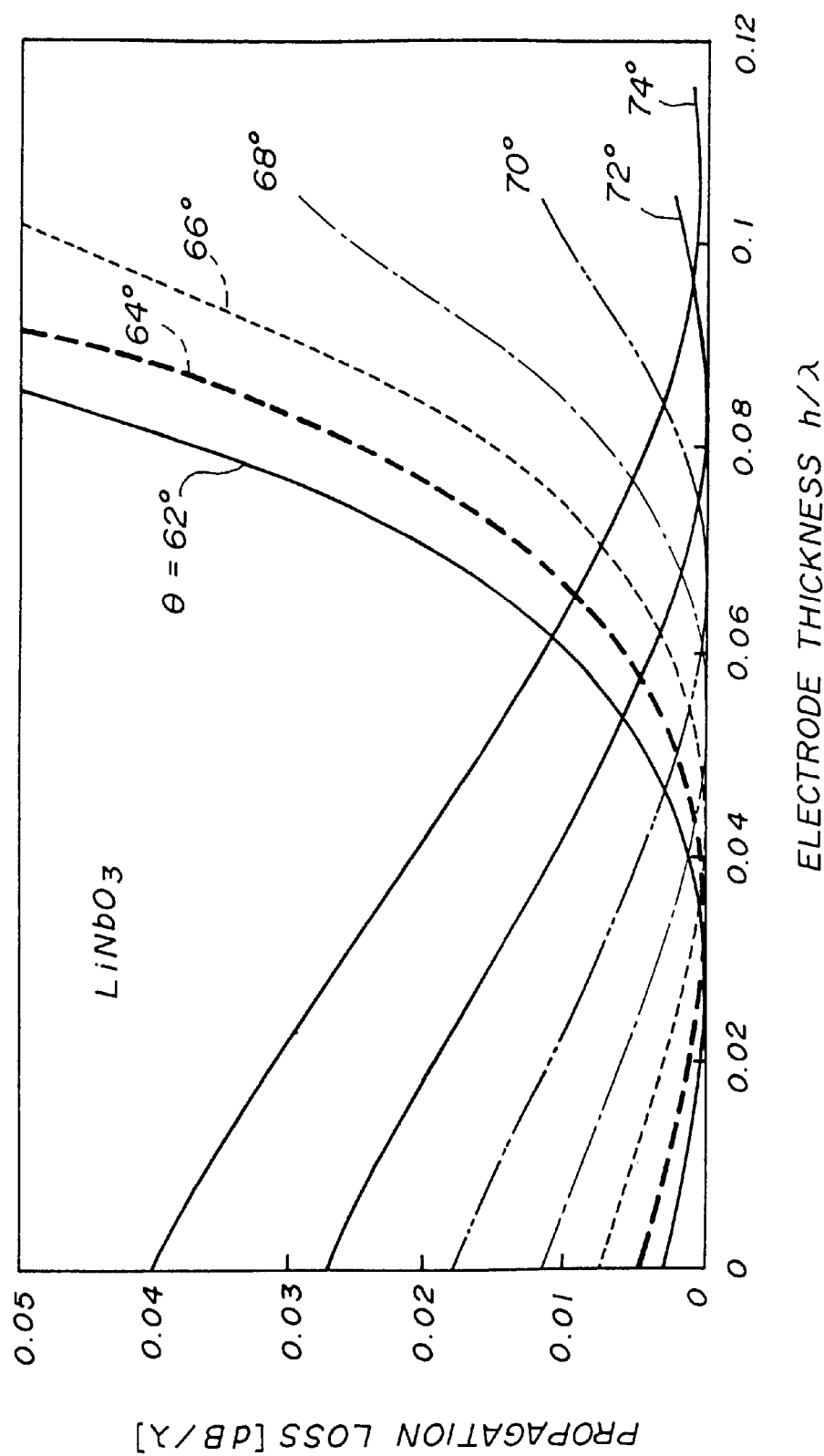
FIG. 14 is a diagram showing the relationship between the propagation loss and the electrode thickness for various cut angles of the LiNbO$_3$ substrate in the SAW device of FIGS. 8A and 8B.

FIG. 14 shows the result of the calculation of the propagation loss for a SAW filter having the construction of FIGS. 8A and 8B except that a Y-X LiNbO$_3$ single crystal is used for the substrate 11 in place of the Y-X LiTaO$_3$ while changing the thickness of the electrode on the substrate 11. In the calculation of FIG. 14, the crystal constants reported by Warner et al., op cit. was used.

Referring to FIG. 14, it will be noted that the propagation loss first decreases to a minimum and then starts to increase exponentially with an increase of the electrode thickness, wherein the minimum of the propagation loss appears at the conventional optimum cut angle of 64° or less only when the electrode thickness is less than 3.5% the wavelength of the excited surface acoustic wave. On the other hand, when the thickness of the electrode is larger than about 4% the wavelength of the excited surface acoustic wave, the minimum of the propagation loss appears at a cut angle exceeding 66°. In other words, under the operational condition of the SAW device in which the thickness of the electrode cannot be ignored with respect to the wavelength of the excited surface acoustic wave, it is desirable to set the cut angle of the LiNbO$_3$ substrate to be larger than about 66°.

On the other hand, when the thickness of the electrode is excessive, the sound velocity in the substrate may be affected by the thickness of the electrode. Further, such a thick electrode may cause a difficulty in patterning the electrode. Because of this reason, it is desirable to set the thickness of the electrode not to exceed 12% of the wavelength of the excited surface acoustic wave. Associated with this, it is preferable to set the cut angle of the LiNbO$_3$ substrate to fall in a range between 66° and 74°.

In the foregoing description, it was assumed that the electrode is formed of an aluminum alloy containing Al and 1 wt % of Cu (Al-1% Cu). When other composition and hence a different mass is used for the electrode, the thickness of the electrode should be changed accordingly. For example, when Au is used for the electrode on a LiTaO$_3$ substrate, the electrode thickness is preferably chosen to fall in the range between 0.4 and 2.1% of the wavelength. Further, when Cu is used for the electrode on a LiTaO$_3$ substrate, the electrode thickness is preferably chosen to fall in the range between 0.9 and 4.5% of the wavelength of the surface acoustic wave.

When a Y-X LiNbO$_3$ single crystal is used for the substrate of the SAW device, on the other hand, it is preferable to set the thickness of an Au electrode to fall in the range between 0.5 and 1.7%. When forming a Cu electrode on the LiNbO$_3$ substrate, it is preferable to set the thickness of the electrode in the range between 1.2 and 3.6% of the wavelength of the surface acoustic wave.

Figure 15A:
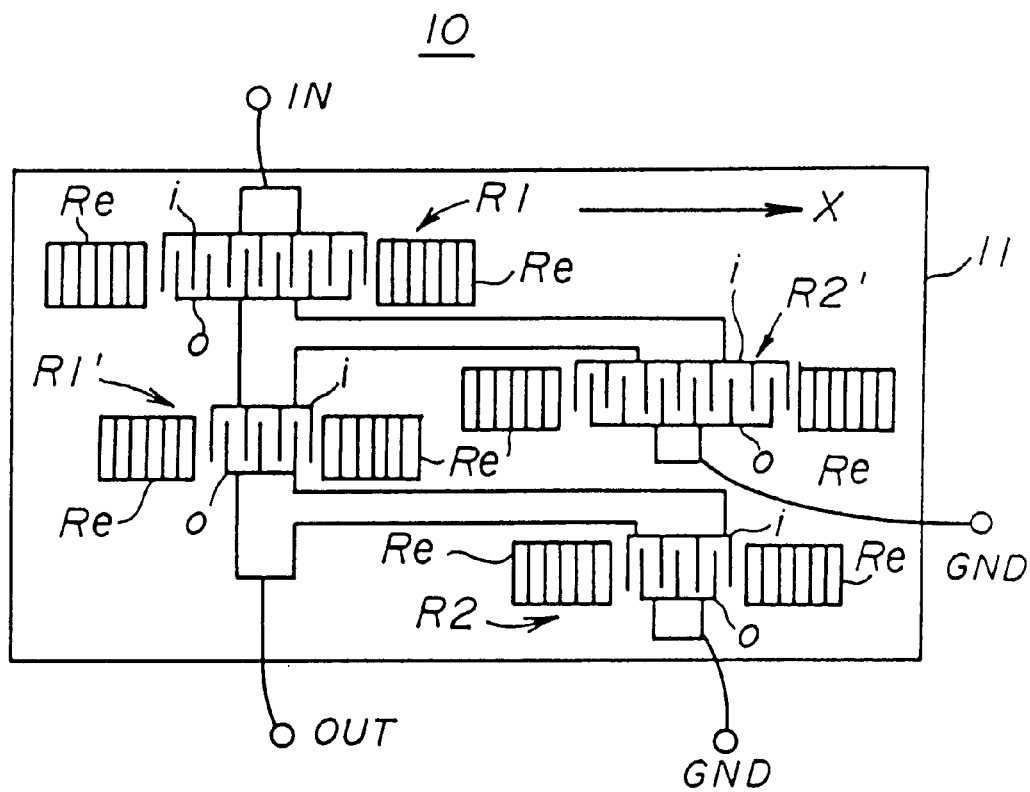
FIGS. 15A and 15B are diagrams showing a modification of the SAW filter of the first embodiment.
Figure 15B:
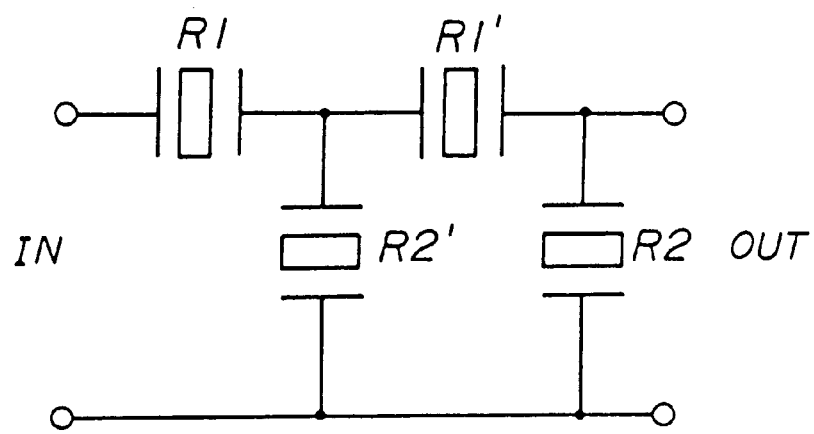

FIG. 15A shows a modification of the SAW filter of FIG. 8A while FIG. 15B shows the equivalent circuit diagram of the SAW filter of FIG. 15A.

Referring to FIG. 15A, the SAW filter is constructed on a Y-X single crystal substrate of LiTaO$_3$ or LiNbO$_3$, similarly to the previous embodiment, wherein the substrate carries thereon a first interdigital electrode R$_1$ having an input-side electrode connected to an input terminal IN provided on the substrate, a second interdigital electrode R$_1$' having an input-side electrode connected to an output-side electrode of the interdigital electrode R$_1$ and an output-side electrode connected to an output terminal, a third interdigital electrode R$_2$' having an inputside electrode connected to the foregoing output-side electrode of the interdigital electrode R$_1$ and a grounded output-side electrode, and a fourth interdigital electrode R$_2$ having an input-side electrode connected to the output-side electrode of the interdigital electrode R$_1$" and a grounded output-side electrode.

Referring to FIG. 15B, the interdigital electrodes R$_1$ and R$_1$' are connected in series, while the interdigital electrodes R$_2$ and R$_2$' are connected parallel with each other at both sides of the interdigital electrode R$_1$'. It should be noted that each of the interdigital electrodes R$_1$, R$_1$', R$_2$ and R$_2$' forms a resonator, and the interdigital electrode R$_1$' has a capacitance about one-half the capacitance of the interdigital electrode R$_1$. On the other hand, the interdigital electrode R$_2$'' has a capacitance twice as large as the capacitance of the interdigital electrode R$_2$.

In the SAW filter of FIGS. 15A and 15B, too, it is possible to minimize the propagation loss in a GHz band operation in which the added mass effect of the electrode becomes conspicuous, by setting the cut angle of the LiTaO$_3$ substrate to be larger than 38° but smaller than about 46°, preferably larger than about 40° but smaller than about 46°, most preferably to about 42°. In the case a Y-X LiNbO$_3$ is used for the substrate, on the other hand, it is preferable to set the cut angle to be larger than 66° but smaller than about 74°, more preferably to about 68°, when the SAW filter is used in the frequency region where the added mass effect is conspicuous.

It should be noted that the present invention is by no means limited to the foregoing ladder type SAW filter but is also applicable to SAW filters of other types, various SAW resonators and SAW delay lines. For example, one may modify the electrode pattern of the SAW filter of FIGS. 8A and 8B to form a lattice type SAW filter shown in FIG. 16.

Figure 17:
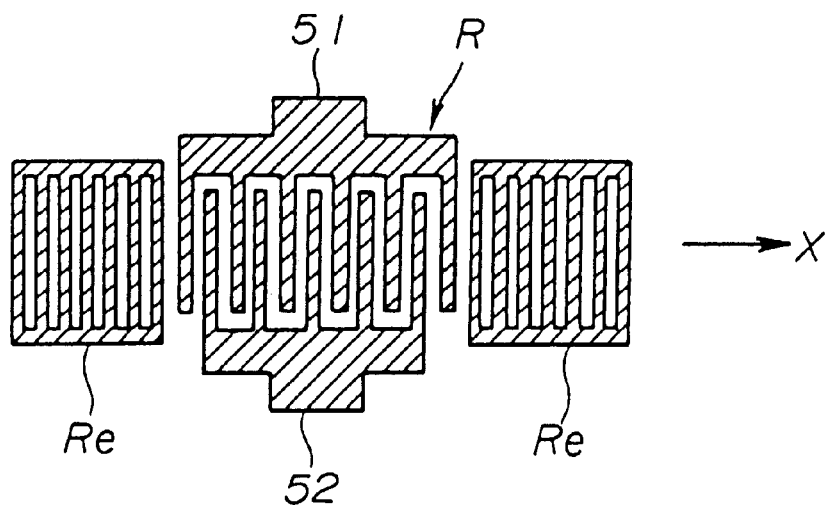
FIG. 17 is a diagram showing the construction of a single port SAW resonator according to a second embodiment of the present invention in a plan view.

FIG. 17 shows the construction of a single port SAW resonator 50 according to a second embodiment of the present invention.

Referring to FIG. 17, the SAW resonator 50 is constructed on the Θ-rotated Y-X cut substrate 11 of LiTaO$_3$ having the cut angle Θ of 38–46°, wherein the substrate 11 carries thereon an interdigital electrode R having a thickness of about 3–15% of the wavelength of the LSAW excited on the substrate 11. Alternatively, the substrate 11 may be formed of a Y-X cut single crystal of LiNbO$_3$ having the cut angle Θ of 66–74°. In this case, the electrode on the substrate 11 has a thickness of about 4–12% of the wavelength of the LSAW excited on the substrate 11. In the present embodiment also, the LSAW propagates in the X-direction.

It will be noted that the SAW resonator 50 carries a single interdigital electrode R and a pair of reflectors R$_e$ are disposed at both sides of the electrode R in the X-direction. The resonator 50 is thereby driven by applying a voltage across a first terminal 51 connected to the first group of electrode fingers of the interdigital electrode R and a second terminal 52 connected to the second group of electrode fingers of the same interdigital electrode R.

In such a construction, it is possible to provide a high Q resonator having a minimum loss, by optimizing the cut angle Θ of the substrate and the thickness of the electrode similarly to the embodiment of FIGS. 8A and 8B.

Figure 18:
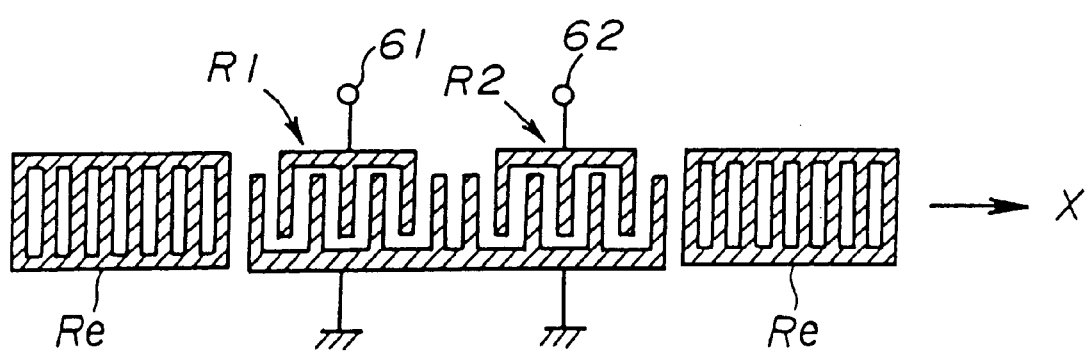
FIG. 18 is a diagram showing the construction of a dual port SAW resonator according to a third embodiment of the present invention.

FIG. 18 shows the construction of a dual port SAW resonator 60 according to a third embodiment of the present invention.

Referring to FIG. 18, the SAW resonator 60 is constructed on the Θ-rotated Y-X cut substrate 11 of LiTaO$_3$ having the cut angle Θ of 38–46°, wherein the substrate 11 carries thereon an interdigital electrode having a thickness of about 3–15% of the wavelength of the LSAW excited on the substrate 11. Alternatively, the substrate 11 may be formed of a Y-X cut single crystal of LiNbO$_3$ having the cut angle Θ of 66–74°. In this case, the electrode on the substrate 11 has a thickness of about 4–12% of the wavelength of the LSAW excited on the substrate 11. In the present embodiment also, the LSAW propagates in the X-direction.

In FIG. 18 it will be noted that the interdigital electrode of the SAW resonator 60 includes an input electrode R$_1$ connected to an input terminal 61 and an output electrode R$_2$ connected to an output terminal 62, wherein the input terminal 61 and the output terminal 62 are disposed in the propagating direction X on the surface acoustic wave. Further, each of the interdigital electrodes R$_1$ and R$_2$ is formed of a first interdigital electrode and a second interdigital electrode, wherein the first interdigital electrode of the electrode R$_1$ is connected to the input terminal 61 while the first interdigital electrode of the electrode R$_2$ is connected to the output terminal 62. Further, the second interdigital electrode of the electrode R$_1$ and the second interdigital electrode of the electrode R$_2$ are connected with each other to form a single ground pattern. At both sides of the interdigital electrode thus formed of the electrode R$_1$ and the R$_2$, a pair of reflectors R$_e$ are disposed as usual.

In the dual port SAW resonator 60, too, it is possible to maximize the Q-factor and minimize the loss by optimizing the cut angle of the substrate and the thickness of the interdigital electrode similarly to the SAW filter of FIGS. 8A and 8B.

Figure 16:
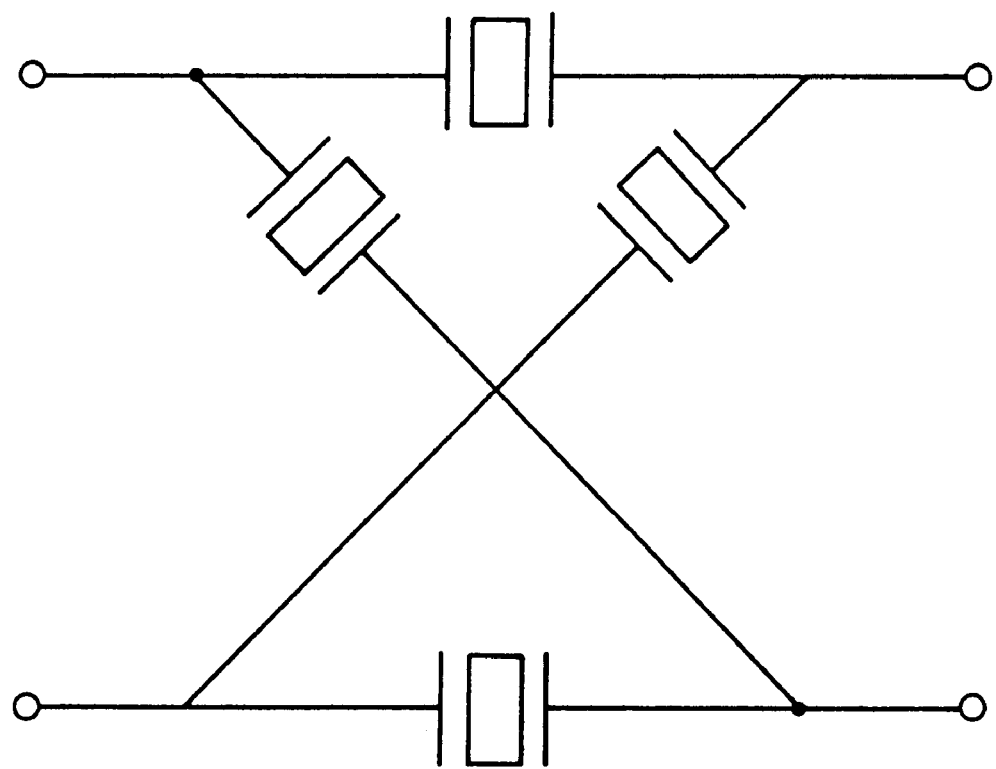
FIG. 16 is an equivalent circuit diagram of a SAW filter according to a further modification of the first embodiment of the present invention.

Thus, the present invention is applicable to various SAW filters and resonators such as the one having the ladder construction as in the case of FIGS. 8B and 15B, or the lattice construction as in the case of FIG. 16. Further, the present invention is applicable to multiple mode filters.

Further, the present invention is not limited to the SAW filter and SAW resonator described heretofore, but is applicable also to SAW delay lines and SAW waveguides as well.

Further, the present invention is by no means not limited to the embodiments described heretofore, but variations and modifications may be possible without departing from the scope of the invention.

What is claimed is:

1. A surface acoustic wave device, comprising:
    a piezoelectric substrate of a single crystal LiTaO$_3$; and
    an electrode pattern provided on a surface of said piezoelectric substrate and containing Al as a primary component;
    said electrode pattern forming a resonator having a thickness in a range of about 0.03–0.15 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle more than 39° and less than about 46°.

2. A surface acoustic wave device as claimed in claim 1, wherein said electrode pattern forms a plurality of resonators, said piezoelectric substrate has an orientation in which said rotational angle is set in the range of about 40–46°.

3. A surface acoustic wave device as claimed in claim 1, wherein said electrode pattern has a thickness in the range of about 0.07–0.15 times the wavelength of the surface acoustic wave excited on said piezoelectric substrate.

4. A surface acoustic wave device as claimed in claim 1, wherein said electrode pattern has a thickness in the range of about 0.05–0.10 times the wavelength of said surface acoustic wave excited on said piezoelectric substrate, and wherein said piezoelectric substrate has an orientation in which said rotational angle is set in the range of about 40–44°.

5. A surface acoustic wave device as claimed in claim 1, wherein said piezoelectric substrate has an orientation in which said rotational angle is set to about 42°.

6. A surface acoustic wave device as claimed in claim 1, wherein said electrode pattern is formed of Al.

7. A surface acoustic wave device as claimed in claim 1, wherein said electrode pattern is formed of an aluminum alloy containing copper.

8. A surface acoustic wave device as claimed in claim 1, wherein said electrode pattern forms a plurality of resonators connected in a ladder type on the surface of said piezoelectric substrate.

9. A surface acoustic wave filter, comprising:

a piezoelectric substrate of a single crystal LiTaO$_3$; and an electrode pattern provided on a surface of said piezoelectric substrate and containing Al as a primary component, said electrode pattern including an interdigital electrode;

said electrode pattern forming a resonator and having a thickness in a range of about 0.03–0.15 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle more than 39° and less than about 46°.

10. A surface acoustic wave resonator, comprising:

a piezoelectric substrate of a single crystal LiTaO$_3$; and an electrode pattern provided on a surface of said piezoelectric substrate and containing Al as a primary component, said electrode pattern including an interdigital electrode;

said electrode pattern having a thickness in a range of about 0.03–0.15 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle more than 39° and less than about 46°;

said interdigital electrode including a first electrode group and a second electrode group, said first electrode group including a first group of electrode fingers provided on said surface of said piezoelectric substrate and connected commonly to a first terminal, said second electrode group including a second group of electrode fingers provided on said surface of said piezoelectric substrate and connected commonly to a second terminal, said first and second group of electrode fingers being disposed such that a second group electrode finger is interposed between a pair of first group of electrode fingers.

11. A surface acoustic wave device, comprising:

a piezoelectric substrate of a single crystal LiTaO$_3$; and an electrode pattern provided on a surface of said piezoelectric substrate and containing Au as a primary component;

said electrode pattern forming a resonator and having a thickness in a range of 0.004–0.021 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle more than 39° and less than about 46°.

12. A surface acoustic wave device, comprising:

a piezoelectric substrate of a single crystal LiTaO$_3$; and an electrode pattern provided on a surface of said piezoelectric substrate and containing Cu as a primary component;

said electrode pattern forming a resonator and having a thickness in a range of 0.009–0.045 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle more than 39° but less than about 46°.

13. A surface acoustic wave device, comprising:

a piezoelectric substrate of a single crystal LiNbO$_3$; and an electrode pattern provided on a surface of said piezoelectric substrate and containing Au as a primary component;

said electrode pattern having a thickness in a range of 0.005–0.017 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle larger than 66° but smaller than about 74°.

14. A surface acoustic wave device, comprising:

a piezoelectric substrate of a single crystal LiNbO$_3$; and an electrode pattern provided on a surface of said piezoelectric substrate and containing Cu as a primary component;

said electrode pattern having a thickness in a range of 0.012–0.036 times a wavelength of a surface acoustic wave excited on said surface of said piezoelectric substrate;

said piezoelectric substrate having an orientation rotated about an X-axis thereof, from a Y-axis thereof, toward a Z-axis thereof, with a rotational angle larger than 66° but smaller than about 74°.

15. A surface acoustic wave device, comprising:

a piezoelectric substrate of a single crystal LiNbO$_3$; and an electrode pattern provided on a surface of said piezoelectric substrate and containing Al as a primary component;

said electrode pattern having a thickness in a range of about 0.04–0.12 times a wavelength of a surface acoustic wave excited on said substrate, said piezoelectric substrate having an orientation rotated about an X-axis thereof, from a Y-axis thereof, toward a Z-axis thereof, with a rotational angle in a range larger than 66° but smaller than about 74°.

16. A surface acoustic wave device as claimed in claim 15, wherein said electrode pattern forms a resonator on said surface of said piezoelectric substrate.

17. A surface acoustic wave device as claimed in claim 15, wherein said electrode pattern forms a lattice filter including a plurality of resonators on said surface of said piezoelectric substrate.

18. A surface acoustic wave device as claimed in claim 15, wherein said electrode pattern forms a multi-mode filter on said surface of said piezoelectric substrate.

19. A surface acoustic wave device as claimed in claim 15, wherein said electrode pattern includes first through fifth interdigital electrodes disposed on said surface of said piezoelectric substrate along a path of said surface acoustic wave, said first interdigital electrode comprising a plurality of a first group of electrode fingers connected commonly to an input terminal and a plurality of a second group of electrode fingers intervening between said first group of electrode fingers, each of said first and second group of electrode fingers crossing said path of said surface acoustic wave on said surface of said substrate, said second interdigital electrode comprising a plurality of a third group of electrode fingers connected commonly to said second group electrode fingers and a plurality of a fourth group of electrode fingers connected commonly to an output terminal and intervening between said third group of electrode fingers, each of said third and fourth group of electrode fingers crossing said path of said surface acoustic wave on said surface of said substrate, said third interdigital electrode comprising a plurality of a fifth group of electrode fingers connected commonly to said first group of electrode fingers and a plurality of a sixth group of electrode fingers connected commonly to a ground and intervening between said fifth group of electrode fingers, each of said fifth and sixth group of electrode fingers crossing said path of said surface acoustic wave on said surface of said substrate, said fourth interdigital electrode comprising a plurality of a seventh group of interdigital electrode fingers connected commonly to said second group of electrode fingers and a plurality of an eighth group of electrode fingers connected commonly to the ground and intervening between said seventh group of interdigital electrode fingers, each of said seventh and eighth group of electrode fingers crossing said path of said surface acoustic wave on said surface of said substrate, said fifth interdigital electrode comprising a plurality of a ninth group of interdigital electrode fingers connected commonly to said fourth group of electrode fingers and a tenth group of electrode fingers connected commonly to the ground and intervening between said ninth group of electrode fingers, each of said ninth and tenth group of electrode fingers crossing said path of said surface acoustic wave on said substrate.

20. A surface acoustic wave device as claimed in claim 15, wherein said piezoelectric substrate has an orientation in which said rotational angle is set in the range of about of about 68–72°.

21. A surface acoustic wave device as claimed in claim 15 wherein said electrode pattern has a thickness in the range of about 0.05–0.10 times the wavelength of said surface acoustic wave excited on said piezoelectric substrate.

22. A surface acoustic wave device as claimed in claim 15, wherein said electrode pattern is formed of Al.

23. A surface acoustic wave device as claimed in claim 15, wherein said electrode pattern is formed of an aluminum alloy containing copper.

24. A surface acoustic wave device as claimed in claim 15, wherein said electrode pattern forms a ladder filter including a plurality of resonators on said surface of said piezoelectric substrate.

* * * * *